(12) United States Patent
Hsu

(10) Patent No.: US 7,563,119 B2
(45) Date of Patent: Jul. 21, 2009

(54) MOUNTING PIN AND PLUGHOLE ARRANGEMENT

(75) Inventor: Rong-Xian Hsu, Banciao (TW)

(73) Assignee: T-Conn Precision Corporation, Banciao (TW)

( * ) Notice: Subject to any disclaimer, the term of this patent is extended or adjusted under 35 U.S.C. 154(b) by 0 days.

(21) Appl. No.: 11/855,340

(22) Filed: Sep. 14, 2007

(65) Prior Publication Data

US 2008/0227326 A1    Sep. 18, 2008

(51) Int. Cl.
*H01R 13/62*    (2006.01)
(52) U.S. Cl. ........................... 439/326; 439/567
(58) Field of Classification Search ................. 439/326, 439/327, 328, 567
See application file for complete search history.

(56) References Cited

U.S. PATENT DOCUMENTS 2,914,276 A * 11/1959 Antalek et al. ............. 248/27.3
3,511,982 A * 5/1970 Salter ........................ 362/382
6,726,505 B2 * 4/2004 Cermak et al. .............. 439/567
6,824,390 B2 * 11/2004 Brown et al. ................. 439/57
7,226,304 B1 * 6/2007 Ju ............................... 439/326
7,241,171 B2 * 7/2007 Herzog ....................... 439/547
2007/0105425 A1 * 5/2007 Wang ......................... 439/326
2007/0202732 A1 * 8/2007 Yahiro et al. ............... 439/326

* cited by examiner

*Primary Examiner*—Hien Vu
(74) *Attorney, Agent, or Firm*—Morris Lin; T-Conn Precision Corp.

(57) ABSTRACT

A mounting pin and plughole arrangement is disclosed include a plughole formed on a circuit board, and a mounting pin downwardly extending from a frame body and having a shank with two hooked portions for fastening to the plughole to lock the frame body to the circuit board by: inserting the shank of the mounting pin through the center of the plughole and then rotating the mounting pin through an angle to force top locating blocks of the hooked portions into engagement with retaining holes that form a part of the plughole.

3 Claims, 6 Drawing Sheets

MOUNTING PIN AND PLUGHOLE ARRANGEMENT

This application claims the priority benefit of Taiwan patent application serial No. 96108996 filed on Mar. 15, 2007.

BACKGROUND OF THE INVENTION

1. Field of the Invention

The present invention relates to a mounting pin and plughole arrangement for the connection of a frame body of a device to a circuit board. More specifically, the present invention relates to a mounting pin and plughole arrangement, which allows the mounting pin to be locked to the plughole through a rotary motion.

2. Description of the Related Art

Following fast development of technology, different advanced electronic devices have been continuously developed to bring convenience to people. To satisfy market demand, advanced electronic products are made to have a small size, which is convenient for carriage and storage. Therefore, computer and electronic products manufacturers put a lot of efforts to develop electronic products with light, thin, short and small characteristics.

Many interface mounting structures have been disclosed for low profile application. However, these conventional interface mounting structure designs may not have sufficient structural strength, or may be inconvenient for manual manipulation during installation due to small size. Therefore, it is inconvenient to install conventional interface mounting structures.

In order to eliminate the aforesaid problems, the inventor invented a cost-effective interface mounting structure, entitled "Mounting Device of Interface Card", filed on Apr. 25, 2006, under application Ser. No. 95,114,607. The mounting device is directly injection-molded from plastics, suitable for mass production. On Sep. 19, 2006, the inventor filed another invention entitled "Grounding Structure of Mounting Device for Interface Card", under application Ser. No. 95,134,648. According to the aforesaid designs, it requires much more effort to connect the mounting pin 11 of the frame body 10 to the oval plughole 21 of the circuit board 20. During installation, the mounting pin 11 may be damaged accidentally.

Because the frame body 10 has a small size, and the mounting pin 11 beneath the frame body 10 is about 2 mm (see FIGS. 1 and 2). The mounting pin 11 comprises an oval shank 110 (2 mm in length×4 mm in width), and two hooked portions 110a protruded from the bottom end of the oval shank 110 at two sides. The projecting distance of each hooked portion 110a is about 0.25 mm. Further, the oval shank 110 has splits 110b, and therefore the oval shank 110 is radially compressible to facilitate insertion of the shank 110 with the hooked portions 110a into the oval plughole 21 of the circuit board 20. Because the total length of the mounting pin 11 is just about 2 mm and because of the effect of the material strength, much more effort must be employed to have the hooked portions 110a be radially inwardly compressed and inserted through the oval plughole 21. When forcing the hooked portions 110a into the plughole 21, the hooked portions 110a may be damaged accidentally.

Therefore, it is desirable to provide a mounting pin and plughole mounting arrangement that eliminates the aforesaid problem.

SUMMARY OF THE INVENTION

The present invention has been accomplished under the circumstances in view. It is the main object of the present invention to provide a mounting pin and plughole arrangement for the connection of a frame body of a device to a circuit board, which allows the mounting pin to be locked to the plughole through a rotary motion, facilitating installation of the device in the circuit board.

To achieve this and other objects of the present invention, the mounting pin and plughole arrangement comprises a plughole formed on a circuit board, and a mounting pin downwardly extending from the bottom side of a frame body of a device for fastening to the plughole to lock the device to the circuit board. The plughole is formed of a center hole, a plurality of border holes disposed in communication with the center hole, and a plurality of retaining holes disposed in communication with the center hole and spaced from the border holes. The mounting pin comprises a shank insertable through the center hole, two hooked portions protruded from the shank and insertable through the border holes, and a plurality of locating blocks protruded from the hooked portions at the top for engaging the retaining holes of the plughole. After insertion of the shank and the hooked portions through the center hole and border holes of the plughole, the shank is rotated through an angle to force the locating blocks into engagement with the retaining holes of the plughole, and therefore the mounting pin is locked to the plughole.

DETAILED DESCRIPTION OF THE PREFERRED EMBODIMENT

Figure 1:
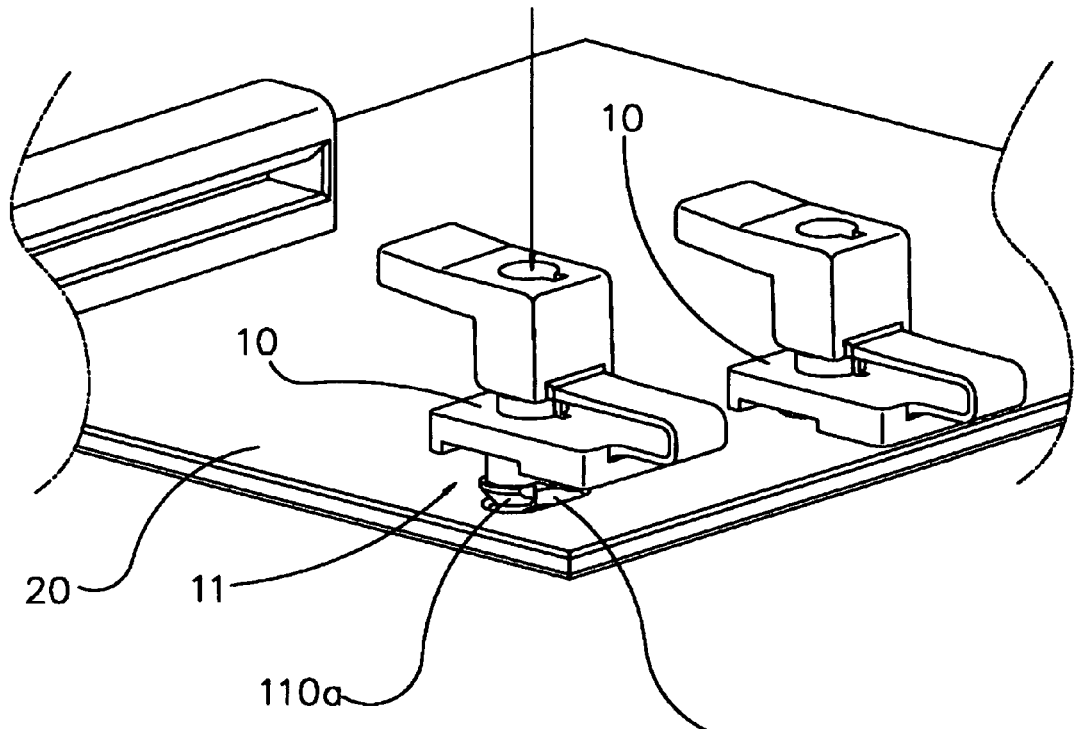
FIG. 1 is a schematic perspective view of a prior art.
Figure 2:
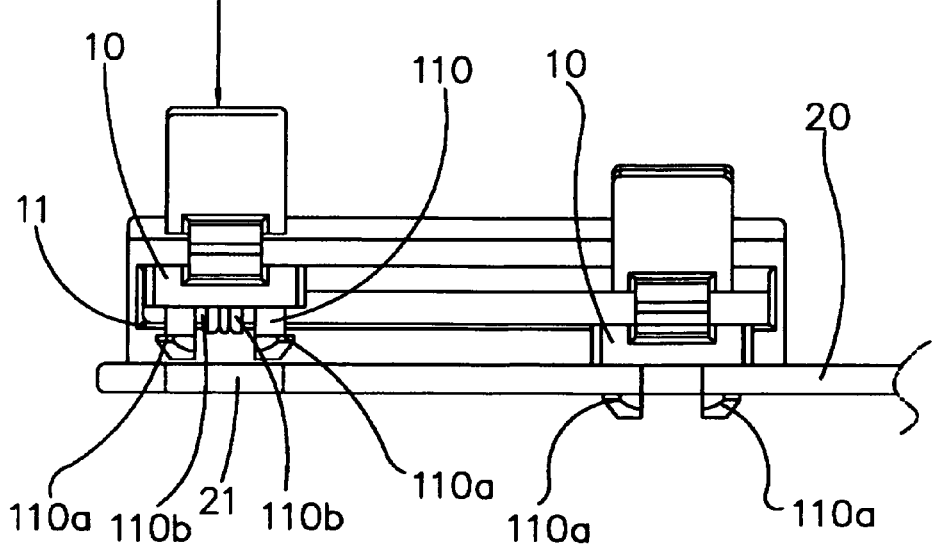
FIG. 2 is a schematic front view of the prior art.
Figure 3:
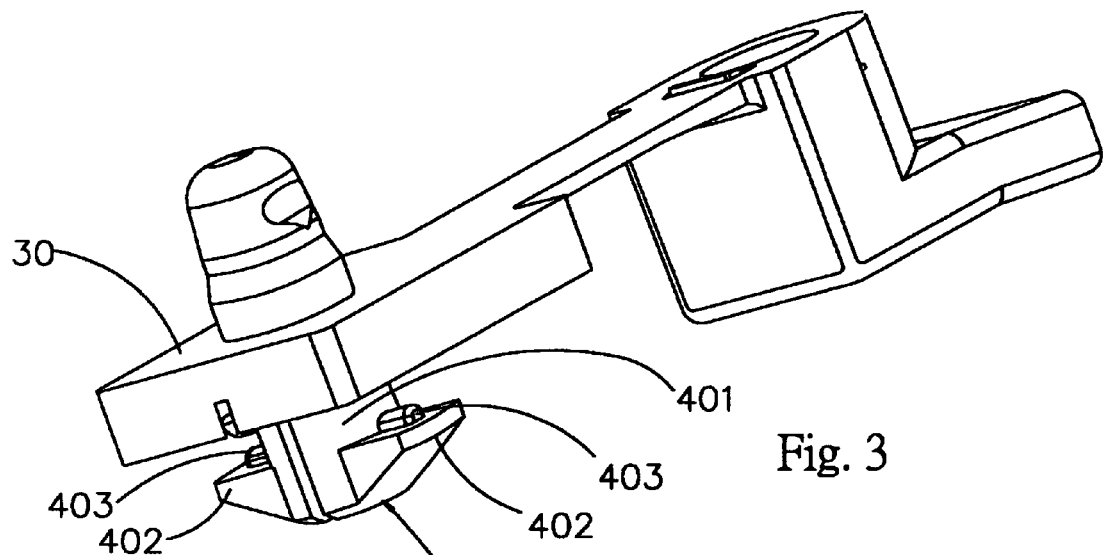
FIG. 3 is a schematic perspective view of a preferred embodiment of the present invention.
Figure 4A:
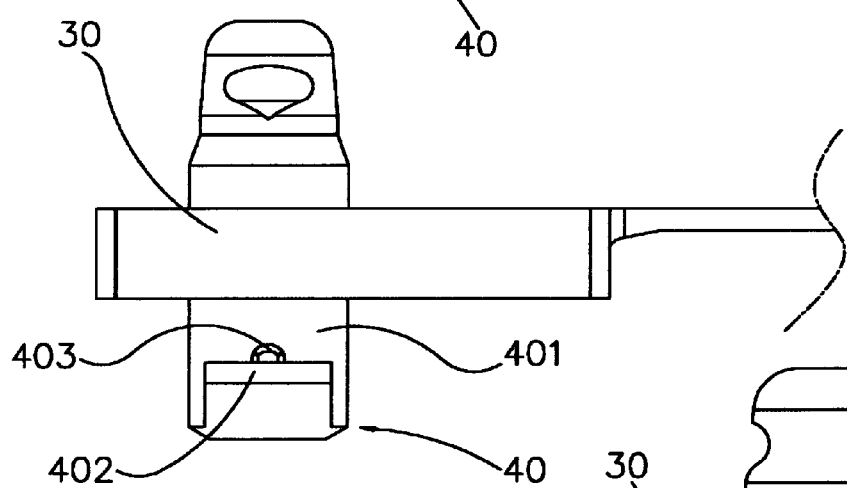
FIG. 4A is a schematic side view of a preferred embodiment of the present invention.
Figure 4:
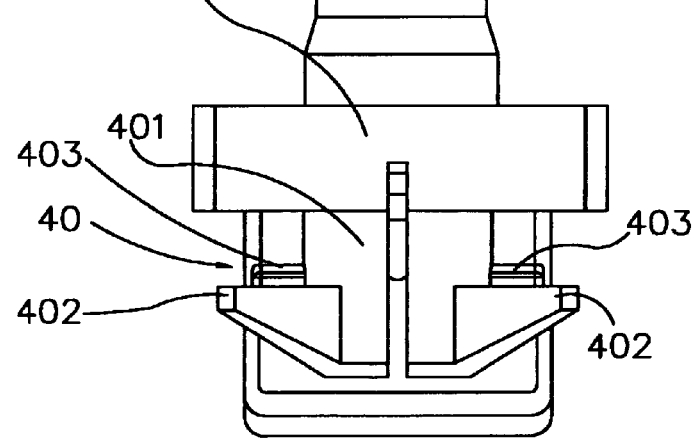
FIG. 4 is a schematic front view of a preferred embodiment of the present invention.

Referring to FIGS. 3, 4 and 4A, a mounting pin 40 is shown extending downwards from the bottom side of a frame body 30. The mounting pin 40 comprises a shank 401, two hooked portions 402 bilaterally extending from the bottom end (free end) of the shank 401, and two locating blocks 403 respectively protruded from the flat top side of each of the hooked portions 402. The hooked portions 402 have a width slightly smaller than the diameter of the shank 401.

Figure 5:
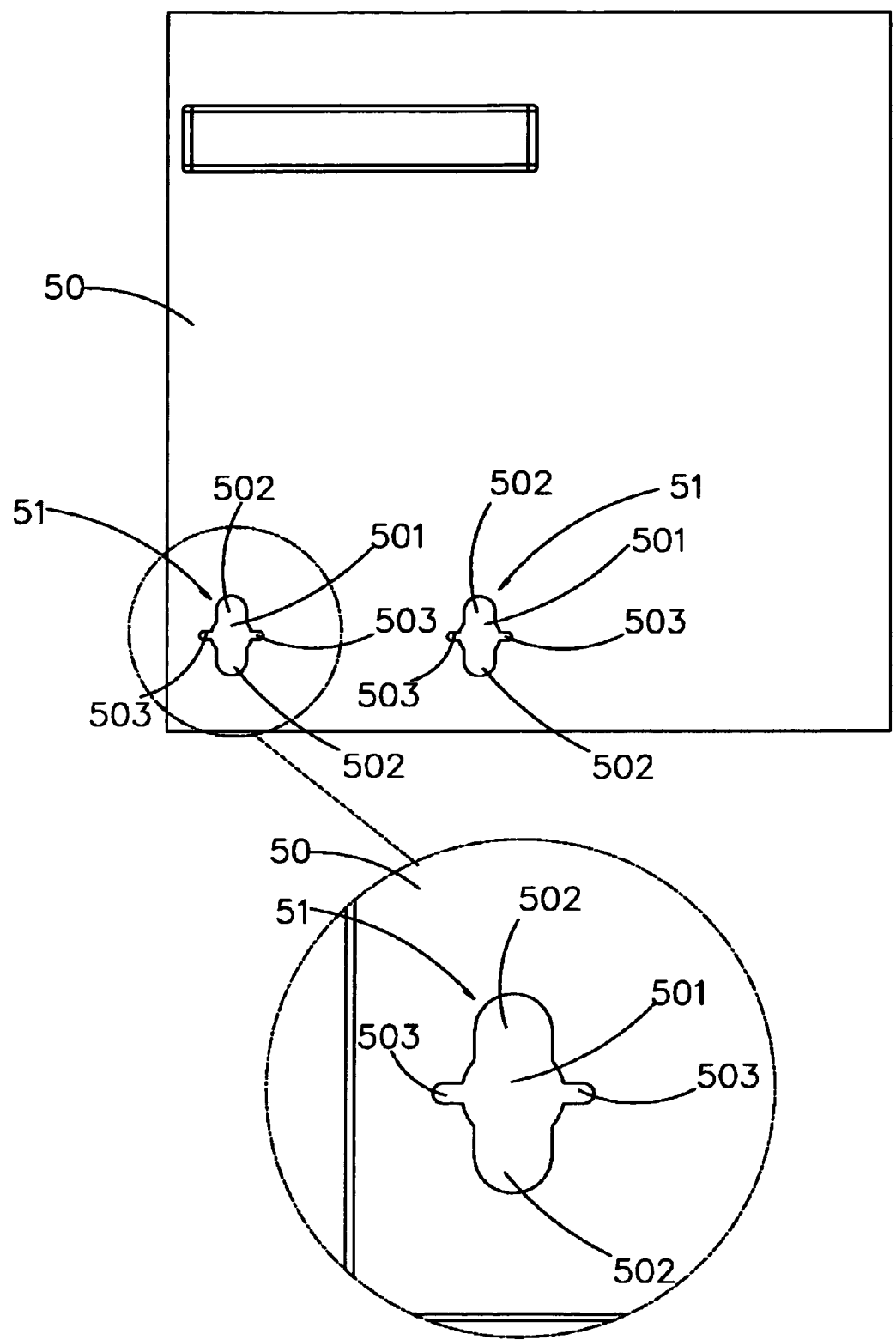
FIG. 5 is a schematic drawing showing a structure of the plughole on the circuit board according to a preferred embodiment of the present invention.
Figure 6:
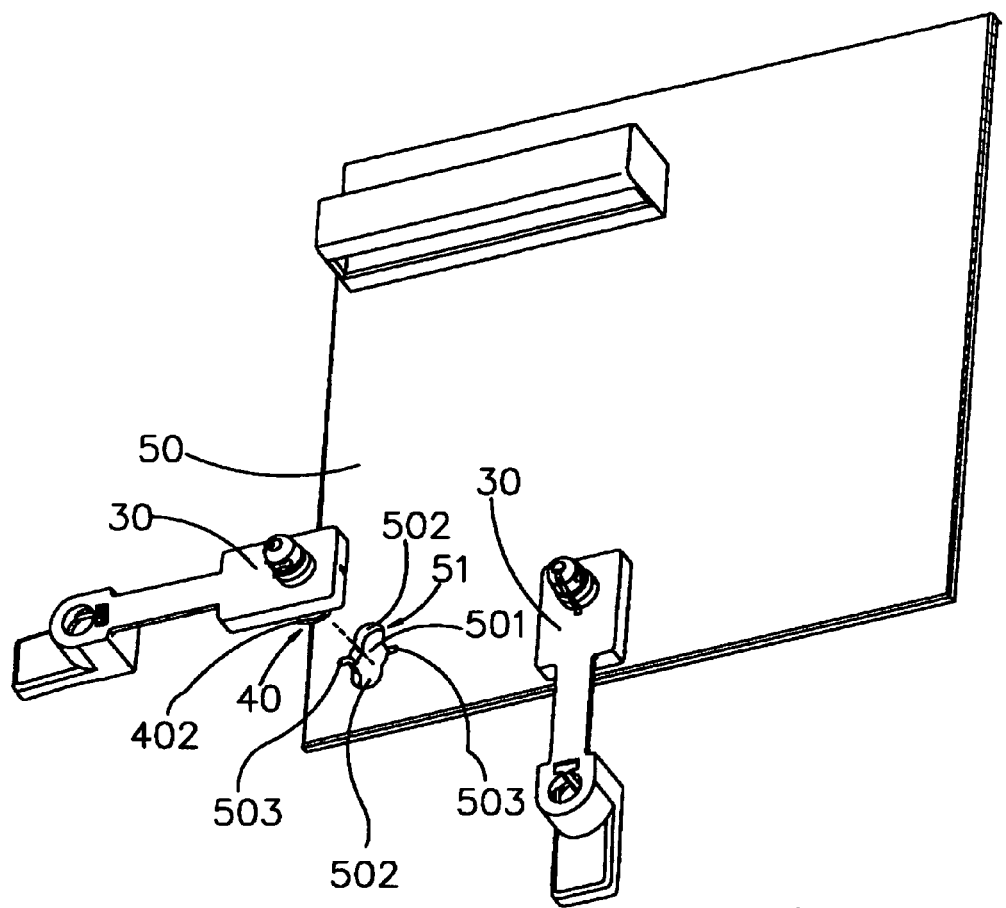
FIG. 6 is a schematic drawing showing a mounting procedure of a preferred embodiment of the present invention.
Figure 7:
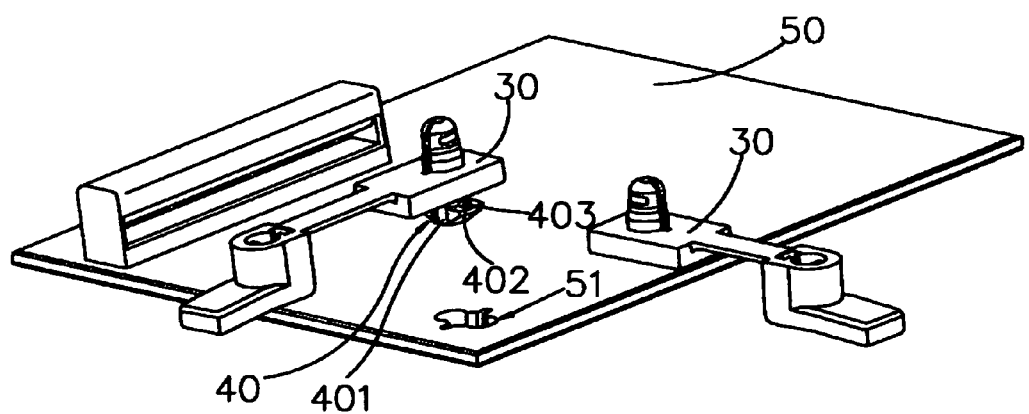
FIG. 7 corresponds to FIG. 6 when viewed from another angle.
Figure 8:
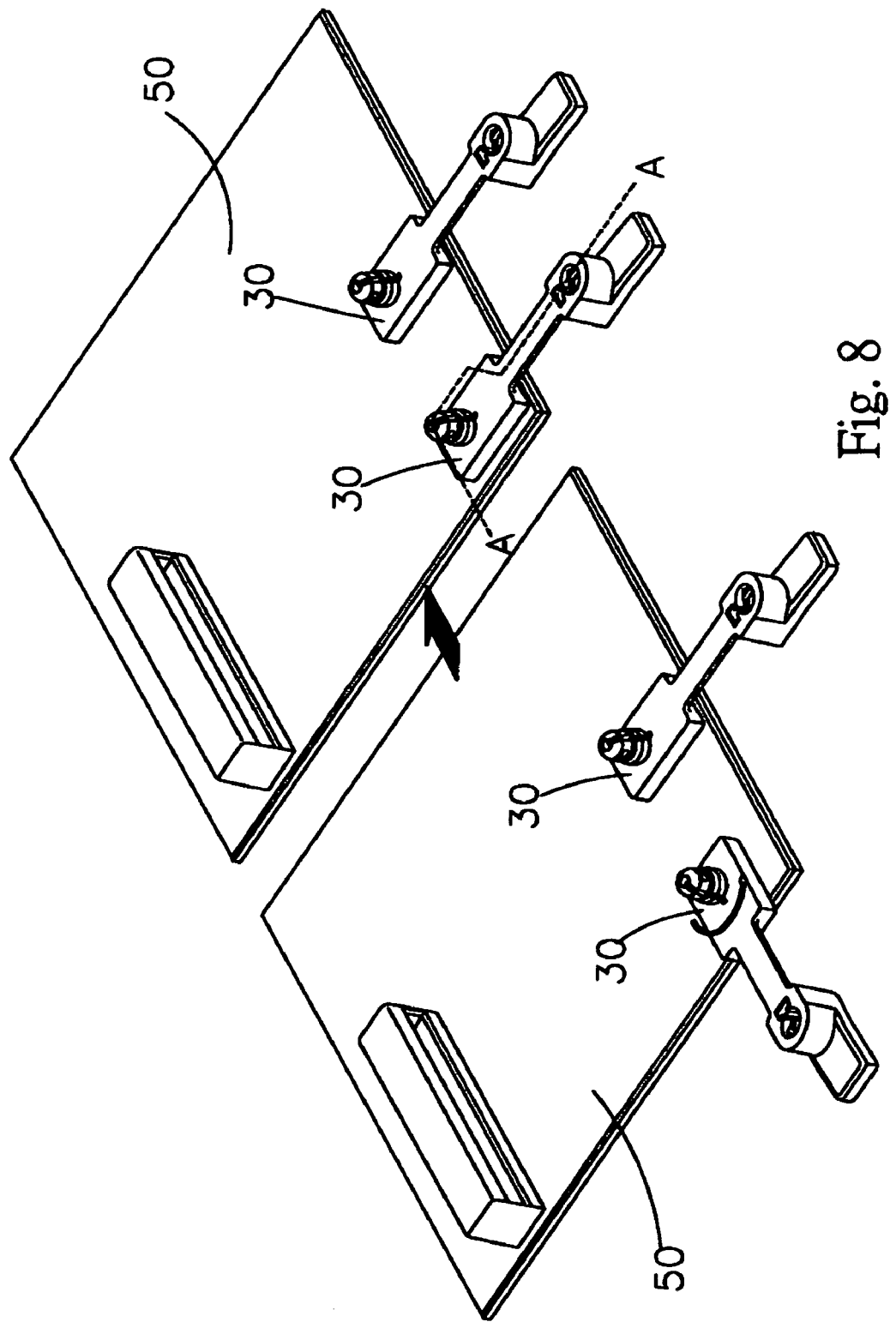
FIG. 8 is a schematic drawing showing the mounting pin inserted through the mounting hole of the circuit board and rotated with the frame body relative to the circuit board through an angle.

Referring to FIG. 5, the mounting pin 40 is connectable to one plughole 51 of a circuit board 50 to secure the frame body 30 to the circuit board 50. The plughole 51 comprises a center hole 501, two border holes 502 disposed in communication with the center hole 501 at two opposite sides, and two retaining holes 503 disposed in communication with the center hole 501 at two opposite sides and equally spaced from the border holes 502. The border holes 502 have a diameter smaller than the center hole 501.

Figure 9:
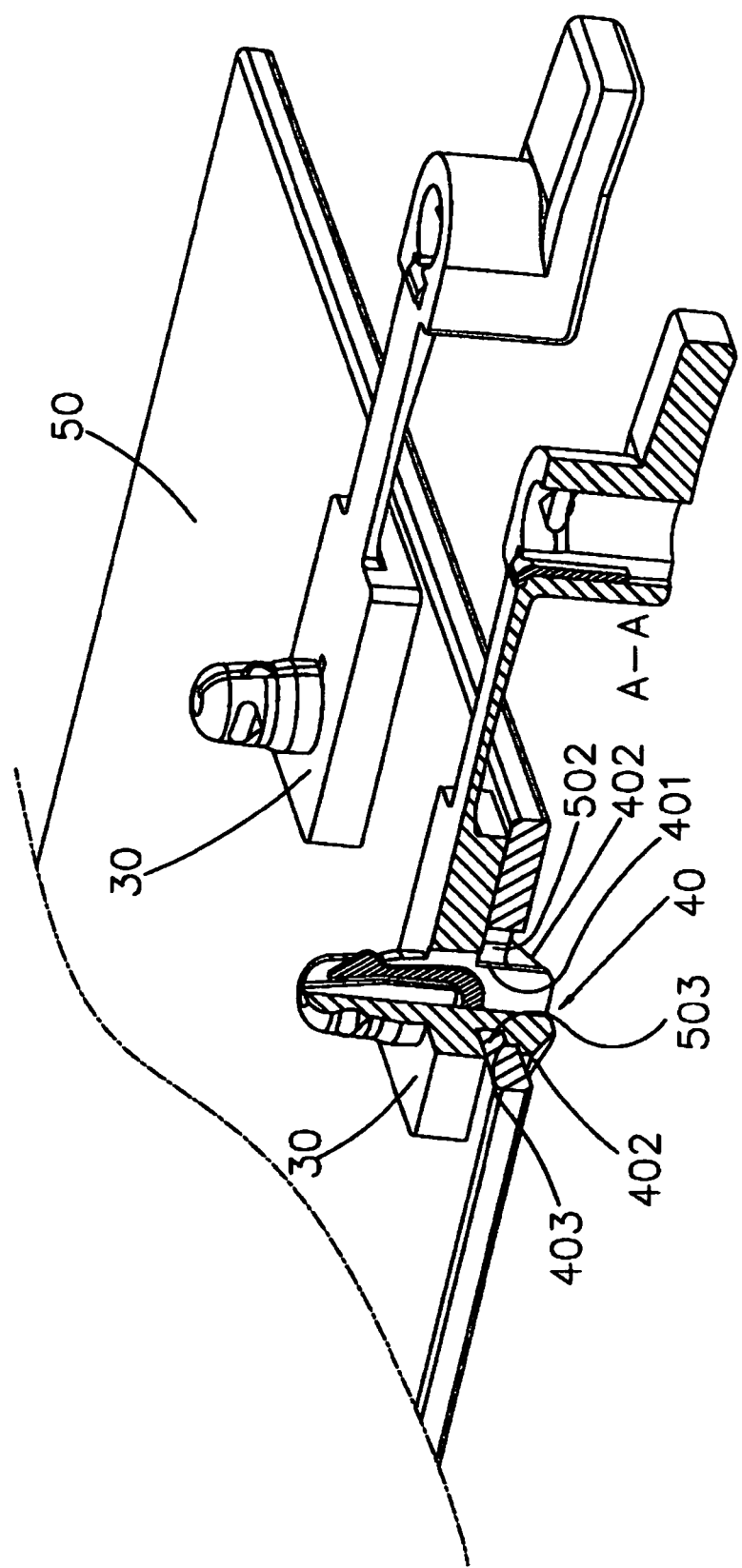
FIG. 9 is a cutaway view of a preferred embodiment of the present invention, showing the locating blocks of the mounting pin engaged into the retaining holes of the plughole of the circuit board.

Referring to FIGS. 6~9 and FIG. 5 again, the mounting pin 40 is fastened to the plughole 51 of the circuit board 50 by: aiming the hooked portions 402 at the border holes 502 and then inserting the shank 401 through the center hole 501 (see FIGS. 6 and 7), and then turning the mounting pin 40 with the frame body 30 relative to the circuit board 50 through an, angle (see FIG. 8) to force the two locating blocks 403 into engagement with the two retaining holes 503 respectively and to have the two hooked portions 402 be stopped at the bottom side of the circuit board 50 (see FIG. 9). When installed, the frame body 30 is locked to the circuit board 50.

The shank 401 of the aforesaid mounting pin 40 can be made having a circular cross section. Alternatively, the shank 401 can be made having a flat shape. Further, the shank 401 can be a split shank having longitudinal crevices to facilitate installation.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A mounting pin and plughole arrangement, comprising:
    a frame body;
    a plughole formed on a circuit board; and
    a mounting pin, comprising a shank, two hooked portions bilaterally protruding in opposite directions from the shank and a locating block on each of the hook portions, downwardly extending from the frame body for fastening to said plughole to lock said frame body to said circuit board, wherein said plughole comprises:
        a center hole, a plurality of border holes disposed in communication with said center hole; and
    two of retaining holes disposed in communication with said center hole and spaced from said border holes, wherein said shank of said mounting pin is inserted through said center hole such that said hooked portions pass through said border holes, and said shank is rotated relative to said circuit board until said locating blocks respectively engage with said retaining holes of said plughole.

2. The mounting pin and plughole arrangement as claimed in claim 1, wherein said shank is inserted with said hooked portions through the center hole and border holes of said plughole and rotated with said frame body relative to said circuit board through an angle to force said locating blocks into engagement with the retaining holes of said plughole respectively.

3. The mounting pin and plughole arrangement as claimed in claim 1, wherein said shank is a split shank having longitudinal crevices.

* * * * *